(12) United States Patent
Ko et al.

(10) Patent No.: US 11,791,382 B2
(45) Date of Patent: Oct. 17, 2023

(54) POWER SEMICONDUCTOR

(71) Applicants: Tso-Tung Ko, Taipei (TW); Brian Cinray Ko, Taipei (TW); Kuang-Ming Liao, Taipei (TW); Chen-Yu Liao, Taipei (TW)

(72) Inventors: Tso-Tung Ko, Taipei (TW); Brian Cinray Ko, Taipei (TW); Kuang-Ming Liao, Taipei (TW); Chen-Yu Liao, Taipei (TW)

( * ) Notice: Subject to any disclaimer, the term of this patent is extended or adjusted under 35 U.S.C. 154(b) by 0 days.

(21) Appl. No.: 17/949,185

(22) Filed: Sep. 20, 2022

(65) Prior Publication Data

US 2023/0013532 A1    Jan. 19, 2023

Related U.S. Application Data

(62) Division of application No. 16/856,019, filed on Apr. 22, 2020, now Pat. No. 11,462,617.

(30) Foreign Application Priority Data

Apr. 30, 2019    (TW) .................................. 108115087

(51) Int. Cl.
| | | |
|---|---|---|
| *H01L 29/10* | (2006.01) | |
| *H01L 29/78* | (2006.01) | |
| *H01L 29/739* | (2006.01) | |
| *H01L 29/08* | (2006.01) | |

(52) U.S. Cl.
CPC ...... *H01L 29/1095* (2013.01); *H01L 29/0852* (2013.01); *H01L 29/7393* (2013.01); *H01L 29/7801* (2013.01)

(58) Field of Classification Search
CPC ............. H01L 29/1095; H01L 29/0852; H01L 29/7393; H01L 29/7801; H01L 23/49562; H01L 24/32; H01L 24/45; H01L 24/48; H01L 24/49; H01L 24/73; H01L 24/05; H01L 24/06; H01L 29/7395; H01L 29/7802; H01L 2224/05124; H01L 2224/05624; H01L 2224/05847; H01L 2224/0603; H01L 2224/32245; H01L 2224/451; H01L 2224/48091; H01L 2224/48247; H01L 2224/49107; H01L 2224/73265; H01L 2924/10253; H01L 23/3672; H01L 23/481; H01L 23/485; H01L 23/4924; H01L 25/0652;
(Continued)

(56) References Cited

U.S. PATENT DOCUMENTS

2016/0181221 A1*    6/2016    Sunaga .................. H01L 25/18
                                                                    257/401

\* cited by examiner

*Primary Examiner* — Moin M Rahman

(57) ABSTRACT

A power semiconductor including a gate, a source, a plurality of first long-strip source metal layer, a drain and a plurality of second long-strip drain metal layer is provided. The source includes a first copper particle layer and a first metal layer that covers the bottom surface of the first copper particle layer. The source is bonded to the first long-strip source metal layer via a first metal pillar. The drain includes a second copper particle layer and a second metal layer that covers the bottom surface of the second copper particle layer. The drain is bonded to the second long-strip drain metal layer via a second metal pillar. The thickness of the first copper particle layer and the second copper particle layer are 5 µm~100 µm. The first copper particle layer and the second copper particle layer are formed by plating and stacking a plurality of large-grain copper.

5 Claims, 7 Drawing Sheets

(58) Field of Classification Search
CPC . H01L 21/265; H01L 21/568; H01L 21/6835; H01L 21/76885; H01L 24/20; H01L 24/19; H01L 24/97; H01L 25/105; H01L 25/0655; H01L 23/3128; H01L 25/0657; H01L 25/50; H01L 24/16; H01L 2224/16145; H01L 2224/1703; H01L 24/17; H01L 24/94; H01L 2221/68345; H01L 2221/68359; H01L 2224/0401; H01L 2224/05147; H01L 2224/73204; H01L 2224/82005; H01L 2225/06517; H01L 2225/06527; H01L 2225/06548; H01L 2225/06572; H01L 2225/06586; H01L 2225/06589; H01L 2924/01013; H01L 2924/01029; H01L 2924/01074; H01L 2924/1431; H01L 2924/1436; H01L 2924/1437; H01L 2924/1438; H01L 23/36; H01L 23/49827; H01L 2225/1041; H01L 2224/83005; H01L 23/5389; H01L 2224/04105; H01L 2224/12105; H01L 2224/16227; H01L 2224/73253; H01L 2224/73267; H01L 2224/81005; H01L 2224/83191; H01L 2224/92225; H01L 2224/92244; H01L 2224/97; H01L 2225/1035; H01L 2225/1058; H01L 2924/15311; H01L 2924/18161; H01L 2924/18162; H01L 2224/02379; H01L 2224/02372; H01L 2224/0231; H01L 2224/8385; H01L 2224/32145; H01L 23/498–49894; H01L 23/538–5389; H01L 21/4846–4867; H01L 21/4807–481; H01L 23/49838; H01L 23/49822; H01L 21/4857; H01L 21/4853; H01L 23/49816; H01L 2224/32225; H01L 2225/1023; H01L 23/5383; H01L 21/561; H01L 25/071; H01L 25/072; H01L 23/5283

See application file for complete search history.

| Thickness of first copper particle layer(μm) | Resistance of first copper particle layer(Ω) | Resistance of 6um aluminum pad structure(Ω) | Resistance of first copper particle layer to Resistance of 6um aluminum pad structure ratio |
| --- | --- | --- | --- |
| 5 | 0.340 | 0.533 | 64% |
| 10 | 0.170 | 0.533 | 32% |
| 15 | 0.113 | 0.533 | 21% |
| 20 | 0.085 | 0.533 | 16% |
| 25 | 0.068 | 0.533 | 13% |
| 30 | 0.057 | 0.533 | 11% |
| 35 | 0.049 | 0.533 | 9% |
| 40 | 0.043 | 0.533 | 8% |
| 45 | 0.038 | 0.533 | 7% |
| 50 | 0.034 | 0.533 | 6% |
| 55 | 0.031 | 0.533 | 6% |
| 60 | 0.028 | 0.533 | 5% |
| 65 | 0.026 | 0.533 | 5% |
| 70 | 0.024 | 0.533 | 5% |
| 75 | 0.023 | 0.533 | 4% |
| 80 | 0.021 | 0.533 | 4% |
| 85 | 0.020 | 0.533 | 4% |
| 90 | 0.019 | 0.533 | 4% |
| 95 | 0.018 | 0.533 | 3% |
| 100 | 0.017 | 0.533 | 3% |
| 105 | 0.017 | 0.533 | 3% |
| 110 | 0.017 | 0.533 | 3% |

Fig. 3

POWER SEMICONDUCTOR

BACKGROUND OF THE INVENTION

1. Field of the Invention

The present invention relates to a power semiconductor, particular to the power semiconductor with large-grain copper.

2. Description of the Prior Art

With reference to FIG. 1 for a perspective of the power semiconductor 10 of prior art. The power semiconductor 10 is one of traditional power semiconductors, and the abbreviation of which is "Mosfet". Some Mosfet have electric current flow in and out of the chip from the surface, but majority of Mosfet are named "TMOS" because the current conduction from source of top layer surface to the drain of bottom layer is like the letter "T". "Power semiconductor" is a semiconductor which can support high voltage, low voltage and control switch of high or low current. "Power semiconductor" would not be damaged in high voltage or current because it has different structure from normal transistor. "Power semiconductor" is mainly used to change voltage and frequency or convert DC and AC besides controlling switch of current.

Next, the working principle of the power semiconductor 10 of prior art is simply explained with FIG. 1 as following:

First, the electrons would enter the source 14 from the source bonding end 11 via the metal wires 11L before laterally spread inside the source 14, which is an aluminum pad normally. Next, the electrons would move down vertically to the transistors in the silicon chip 15 and flow further down to a drain 16. In FIG. 1, the structure of the drain 16 is a thin metal layer, and a metal frame 17 is bonded below the drain 16. Then, the electrons would enter a drain bonding end 13 via the metal frame 17 and leave the power semiconductor 10 through the drain bonding end 13.

In addition, the gate 12 of the power semiconductor 10 is located between the source 14 and the drain 16 to control whether to let electrons continue to move down or cut off the flow of electrons by turning the transistors on or off. However, performance and life of the power semiconductor 10 are restricted because impedance of electron's lateral spreading is too high (High resistance) resulting in high temperature which is caused by the over-thinness of source 14. The aluminum pad structure with thickness around 6 µm is formed by sputtering and dry etch with 6 µm as the limit in current process. In comparison, the thickness of aluminum pad structure of non-power semiconductor is only between 0.25 µm and 1 µm generally. The lateral flow of the electrons can be slightly improved by increasing thickness of metal wires 11L or numbers of metal wires 11L scattered on the source 14, but the effect is very limited.

Therefore, how to reduce electron movement resistance in the power semiconductors and increase cooling efficiency is worth considering for person having ordinary skill in the art.

SUMMARY OF THE INVENTION

A power semiconductor is provided in the instant application, the power semiconductor can reduce electron movement obstruction inside and improve cooling efficiency.

The power semiconductor includes a gate, a source, a plurality of first long-strip source metal layer, a drain and a plurality of second long-strip drain metal layer. The source includes a first copper particle layer and a first metal layer that covers the bottom surface of the first copper particle layer. The source is bonded to the first long-strip source metal layer via a first metal pillar. The drain includes a second copper particle layer and a second metal layer that covers the bottom surface of the second copper particle layer. The drain is bonded to the second long-strip drain metal layer via a second metal pillar. The thickness of the first copper particle layer is greater than the thickness of the first metal layer, the thickness of the second copper particle layer is greater than the thickness of the second metal layer, and the thickness of the first copper particle layer and the second copper particle layer are 5 µm~100 µm, and the first copper particle layer and the second copper particle layer are formed by plating and stacking a plurality of large-grain copper.

In the above power semiconductor, the gate includes a plurality of branch structure disposed between the first long-strip source metal layer and the second long-strip drain metal layer.

In the above power semiconductor, the first copper particle layer and second copper particle layer are as size in 2 µm~50 µm.

In the above power semiconductor, the first metal layer and the second metal layer are made of aluminum, and the thickness of the first metal layer and the second metal layer are 0.25 µm~6 µm but 0.25 µm~1 µm is a preferred better option because it meets all the requirements and costs much lower to manufacture.

In the above power semiconductor, a third copper particle layer is disposed on the top surface of the first long-strip metal layer and the second long-strip metal layer, the thickness of the third copper particle is 5 µm~100 µm, and the third copper particle is formed by stacking a plurality of large-grain copper as size in 2 µm~50 µm.

The foregoing, as well as additional objects, features and advantages of the invention will be more readily apparent from the following detailed description, which proceeds with reference to the accompanying drawings.

BRIEF DESCRIPTION OF THE DRAWINGS

FIG. 3 shows comparison chart of resistance with first copper particle layers 24C of different thicknesses and 6 µm aluminum pad.

DESCRIPTION OF THE PREFERRED EMBODIMENTS

Figure 1:
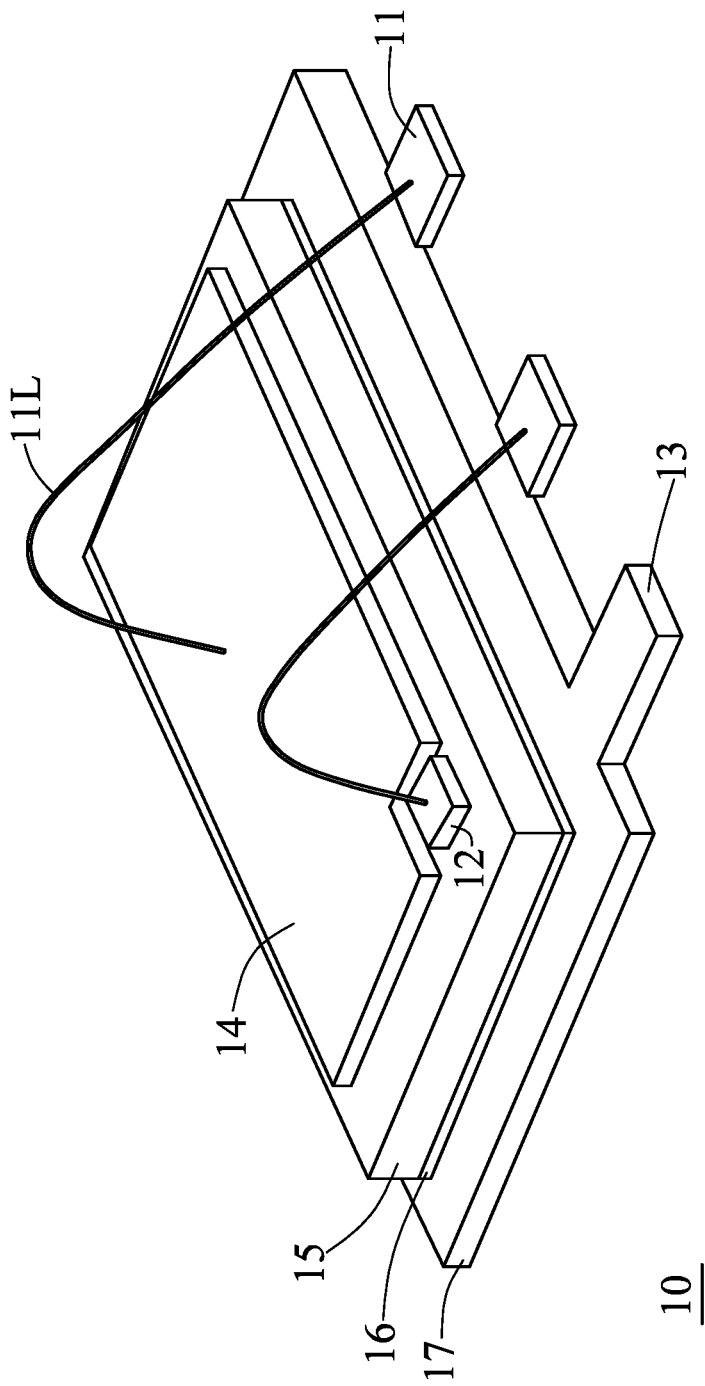
FIG. 1 shows a perspective of the power semiconductor 10 of prior art.
Figure 2:
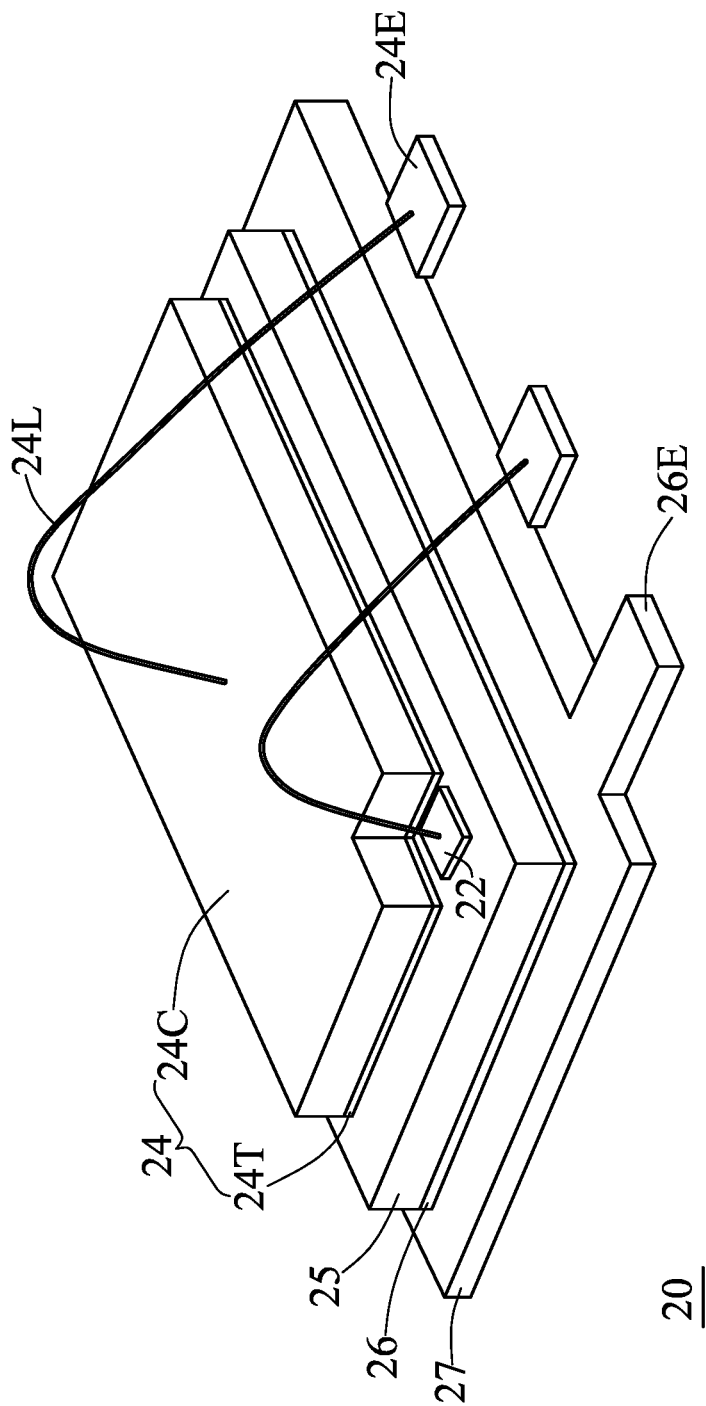
FIG. 2 shows a perspective of power semiconductor 20 of first embodiment.

With reference to FIG. 2 for a perspective of power semiconductor 20 of first embodiment. The power semiconductor 20 includes a source bonding end 24E, a source 24, a gate 22, a silicon chip 25, a drain 26, a drain bonding end 26E, and a metal frame 27. The gate 22 is disposed between the source 24 and the drain 26. The source 24 includes a first copper particle layer 24C and a first metal layer 24T. The first copper particle layer 24C is bonded to the source bonding end 24E via a metal wire 24L, and it covers the top surface of the first metal layer 24T, which is made of aluminum with thickness between 0.25 μm~1 μm. The thickness of the first copper particle layer 24C is thicker than the first metal layer 24T.

In addition, the first copper particle layer 24C is formed by plating and stacking a plurality of large-grain copper or a plurality of stacking tiny copper particles, and the large-grain copper as size in 2 μm~50 μm would be better option in this embodiment. In practical application, the thickness of the first copper particle layer 24C is generally 5 μm~100 μm so that thicker first copper particle layer 24C can effectively reduce resistance and improve cooling of the power semiconductor 20.

In addition, the silicon chip 25 is bonded to the bottom surface of the first metal layer 24T; the drain 26 is bonded to the bottom surface of the silicon chip 25; the metal frame 27 is disposed below the drain 26; the drain bonding end 26E is bonded to the metal frame 27.

In the above, costs of sputtering and dry etch can be significantly reduced while increasing productivity in the processing of power semiconductor 20 because the thickness of first metal layer 24 is reduced from 6 um to 0.25 μm~1 μm. Furthermore, although aluminum of thickness in the range of 0.25 μm~1 μm has high resistance, the thick first copper particle layer 24C has significantly lower resistance so that the electrons would choose the first copper particle layer 24C as the main conductor. The first copper particle layer 24C can prevent metal atoms from being affected by heat and large currents when the power semiconductor 20 needs to withstand high currents and not to produce high temperatures. Electro migration caused by affected atoms can form voids between the first copper particle layer 24C and the first metal layer 24T, subsequently affects electron flow, and causes the power semiconductor 20 to be damaged. This is a very common reliability failure problem for power transistors and the applying of a thick large grain copper layer can effectively eliminate this problem.

With reference to FIG. 3, a comparison chart for resistance of first copper particle layers 24C of different thicknesses to the resistance of 6 μm aluminum pad. Applicant used a plurality of first copper particle layers 24C of different thicknesses to measure resistance of electron flows laterally spreading in the first copper particle layers 24C and the traditional 6 μm aluminum pad structure. Applicant further compared resistance of the first copper particle layer 24C with 6 μm aluminum pad structure, and the final results are shown as in the comparison chart of FIG. 3. The FIG. 3 clearly shows resistance of the first copper particle layers 24C is 0.34Ω when the thickness of the first copper particle layers 24C is 5 μm, and the ratio to resistance of the traditional 6 μm aluminum pad structure of 0.533Ω is 64%, a 36% reduction! Furthermore, the resistance of the first copper particle layer 24C becomes lower when its thickness is increased. For example, the resistance of the first copper particle layer 24C when its thickness is increased to 10 μm dropped to 0.17Ω, and its ratio to the 6 μm aluminum pad structure becomes only 32%. As the thickness of the first copper particle layer 24C is further increased to 50 μm, its resistance dropped to only 0.034Ω, and its ratio to the 6 μm aluminum pad structure is a mere 6%. The resistance of the first copper particle layer 24C when its thickness goes all the way up to 100 μm dropped to 0.017Ω, and its ratio to the 6 μm aluminum pad structure becomes 3%. Therefore, it is clear that when the first copper particle layer 24C has a thickness of 5 μm or more, it can significantly improve performance and reliability of the power semiconductor 20 when compared to those using 6 μm aluminum pad structure for the source 14. Meanwhile, when the thickness of the first copper particle layer 24C is brought above 5 μm, the cooling efficiency is also significantly improved so that it helps to boost the overall reliability life performance of the power semiconductor 20.

In addition, it can also be concluded with FIG. 3, the flattened resistance of 0.017Ω of first copper particle layer 24C with thickness of 100 μm, 105 μm or 110 μm, the ratio of resistivity to the 6 μm aluminum pad structure becomes a constant 3%. Therefore, the decreasing of resistance of the first copper particle layer 24C slows down and enters a plateau when the thickness of the first copper particle layer 24C becomes thicker than 100 μm. The performance improvement of the power semiconductor 20 is therefore, limited and stopped beyond this point.

In summary, FIG. 3 shows that the first copper particle layer 24C with thickness of 5 μm~100 μm can greatly improve performance and reliability of the power semiconductor 20. However, large-grain copper must be used to avoid electro migration from happening. Voids will still happen to impact reliability if tiny grain copper is used.

Figure 4:
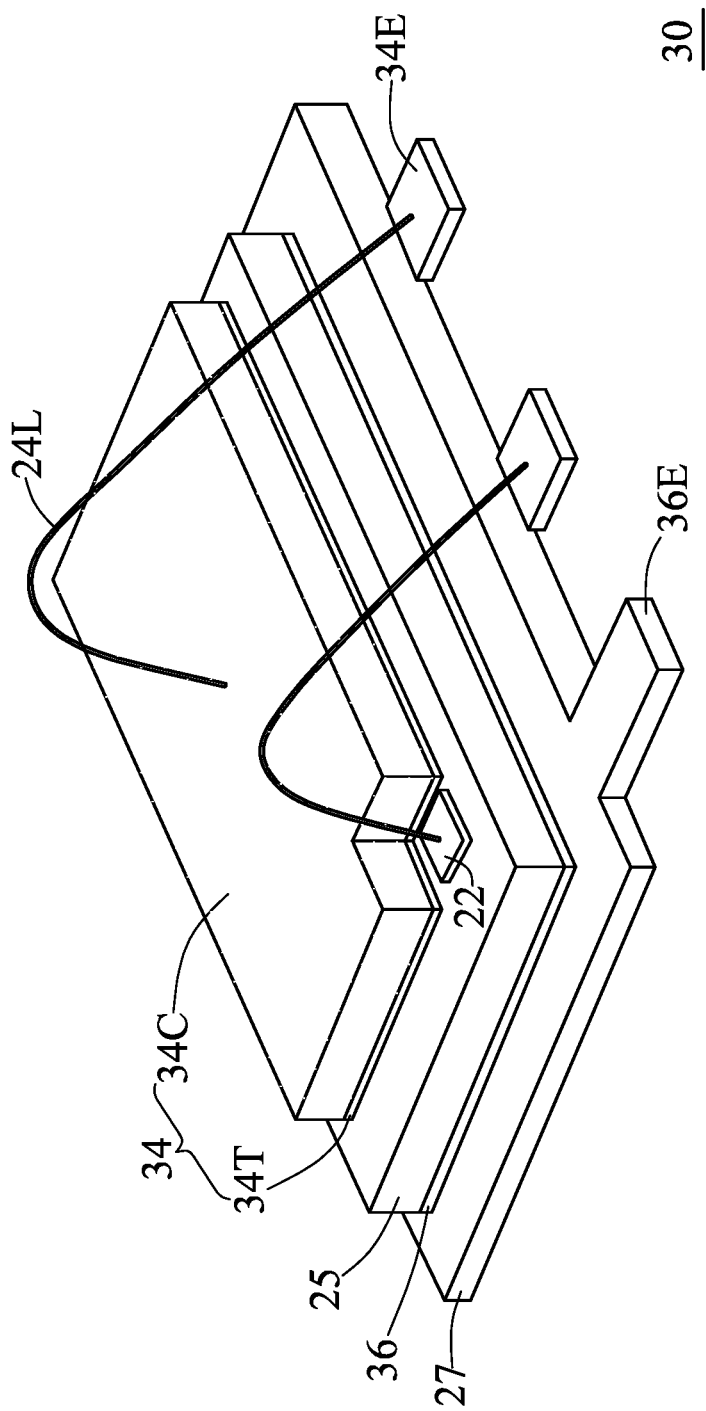
FIG. 4 shows perspective of the power semiconductor 30 of second embodiment.

With reference to FIG. 4 for perspective of the power semiconductor 30 of second embodiment. The difference between power semiconductor 30 and power semiconductor 20 is that original source 24 is replaced with emitter 34, and the drain 26 is replaced with collector 36 in the power semiconductor 30. The emitter 34 similarly includes a first copper particle layer 34C and a first metal layer 34T, which is equivalent to first copper particle layer 24C. In addition, the source bonded end 24E is replaced with emitter bonded end 34E; the drain bonded end 26E is replaced with collector bonded end 36E. In detail, the power semiconductor 30 is an IGBT-type power semiconductor. Electron would choose the first copper particle layer 34C as conductor because which has lower resistance. The use of the first copper particle layer 34C can avoid voids formation by electro migration with the first metal layer 34T and cause damage to the power semiconductor 30. This is only possible when large grain copper is used for the first copper particle layer 34C.

Figure 5:
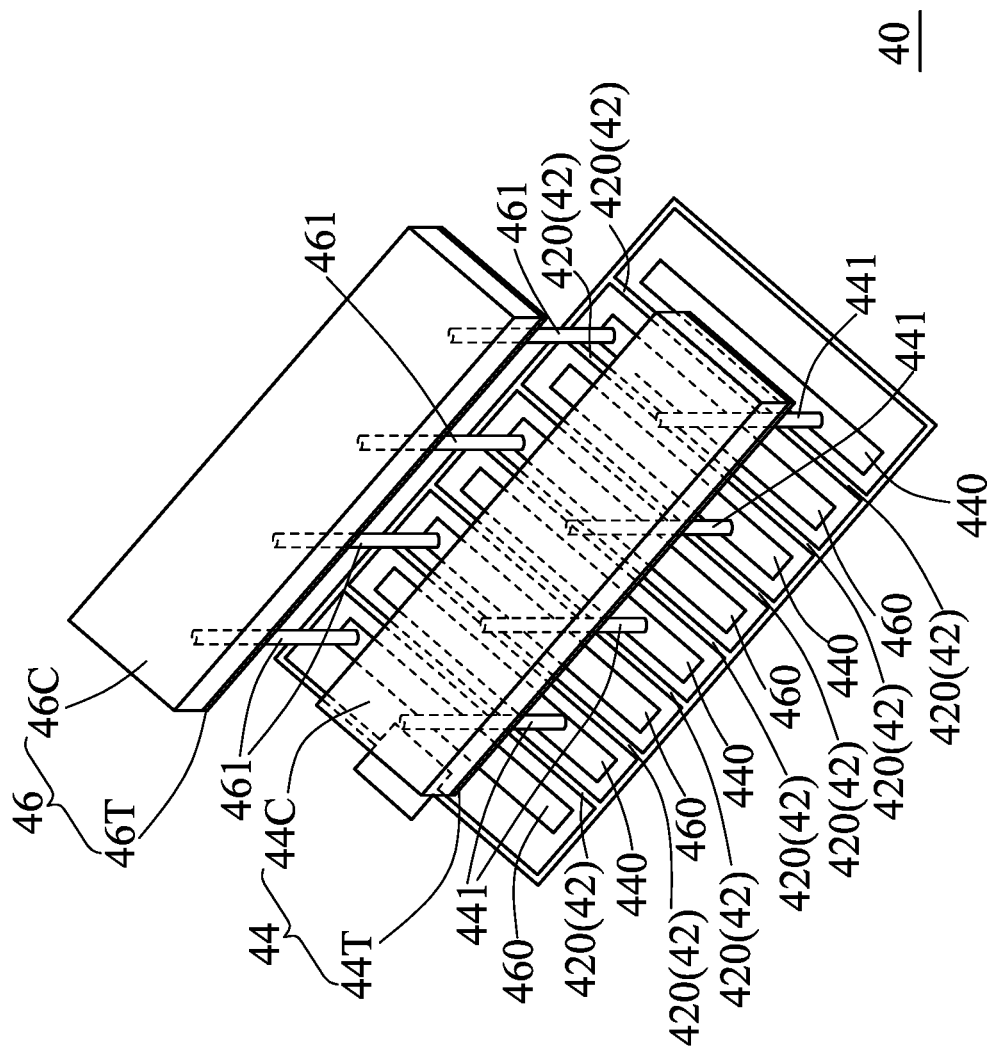
FIG. 5 shows perspective of the power semiconductor 40 of third embodiment.

With reference to FIG. 5 for perspective of the power semiconductor 40 of third embodiment. The power semiconductor 40 includes a gate 42, a source 44, a plurality of first long-strip metal source layer 440, a drain 46 and a plurality of second long-strip metal drain layer 460. The source 44 includes a first copper particle layer 44C and a first metal layer 44T, which as thickness in 0.25 μm~6 μm (preferably 0.25 μm 1 μm) is aluminum. In addition, the first copper particle layer 44C covers the top surface of the first metal layer 44T, and the thickness of the first copper particle layer 44C is thicker than the first metal layer 44T.

The drain 46 includes a second copper particle layer 46C and a second metal layer 46T, which as thickness in 0.25 μm~6 μm (preferably 0.25 μm~1 μm) is aluminum and covers the top surface of the second metal layer 46T, and the thickness of the second copper particle layer 46C is thicker than the second metal layer 46T.

Every first long-strip metal source layer 440 is bonded to the source 44 via a tiny first metal pillar 441. In detail, every first long-strip metal source layer 440 can be considered as extended structure of the source 44 because the first long-strip metal source layer 440 is bonded to the first metal layer 44T of the source 44.

Every second long-strip drain metal layer 460 is bonded to the drain 46 via a tiny second metal pillar 461. In detail, every second long-strip drain metal layer 460 can be considered as extended structure of the drain 46 because second long-strip drain metal layer 460 is bonded to the drain 46.

In practical application, the thickness of first copper particle layer 44C and second copper particle layer 46C are generally 5 μm~100 μm so that thicker first copper particle layer 44C and second copper particle layer 46C can effectively improve transverse conductivity and cooling of the power semiconductor 40. In above, the gate 42 includes a plurality of branch structure 420, which is disposed between the first long-strip source metal layer 440 and the second long-strip drain metal layer 460 to form the transistor structure.

Next, the working principle of the power semiconductor 40 is explained as follows:

The electron current from source 44 would enter the first long-strip source metal layer 440 from top to bottom via the first metal pillar 441 after the gate 42 enables electron flow by turning on the transistor, and then electron moves to the second long-strip drain metal layer 460. Finally, the electrons move upward to the drain 46 via the second metal pillar 461. The gate opens the channel between source 440 and drain 460 to enable electrons flow from source to drain, it is a typical working scheme for transistor. The first copper particle layer 44C and the second copper particle layer 46C greatly improve lateral electron flow and prevent damage to the power semiconductor 40 when the power semiconductor 40 needs to handle high current flow. They also maximize heat dissipation.

In the power semiconductor 40, a third copper particle layer (not be drawn) is disposed on the top surface of the first long-strip metal layer 440 and the second first long layer 460. The structure of the third copper particle layer is stacked by large-grain copper as the first copper particle layer 44C and second copper particle layer 46, and the thickness of the third copper particle layer is 5 μm~100 μm. Therefore, the third copper particle layer can effectively improve electron flow on the first long-strip metal layer 440 and the second long-strip metal layer 460 and reduce operating temperature of the power semiconductor 40.

Figure 6:
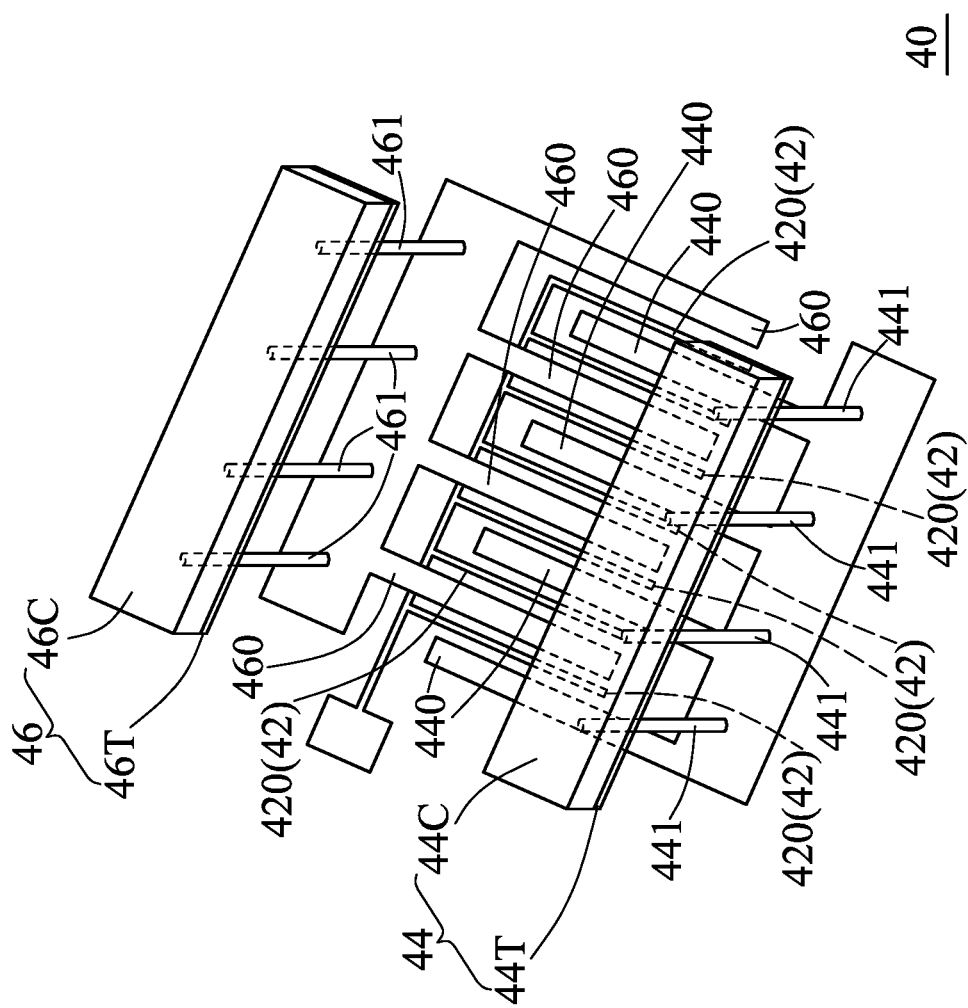
FIG. 6 shows perspective of different exterior of the power semiconductor 40.

With reference to FIG. 6 for perspective of different exterior of the power semiconductor 40. The exterior of the power semiconductor 40 can be presented as FIG. 6 besides FIG. 5, it can reduce moving obstacle of electron and increase cooling speed. The difference between the power semiconductor in FIG. 6 and FIG. 5 is that the branch structure 420, the first long-strip metal layer 440 and the second long-strip metal layer 460 of the power semiconductor 40 can all be formed by the same metal layer in FIG. 5, but in FIG. 6, the branch structure 420 of the power semiconductor 40 passed through below the second long-strip metal layer 460 so that they need be formed separately by doped silicon instead of formed by the same metal layer.

Figure 7:
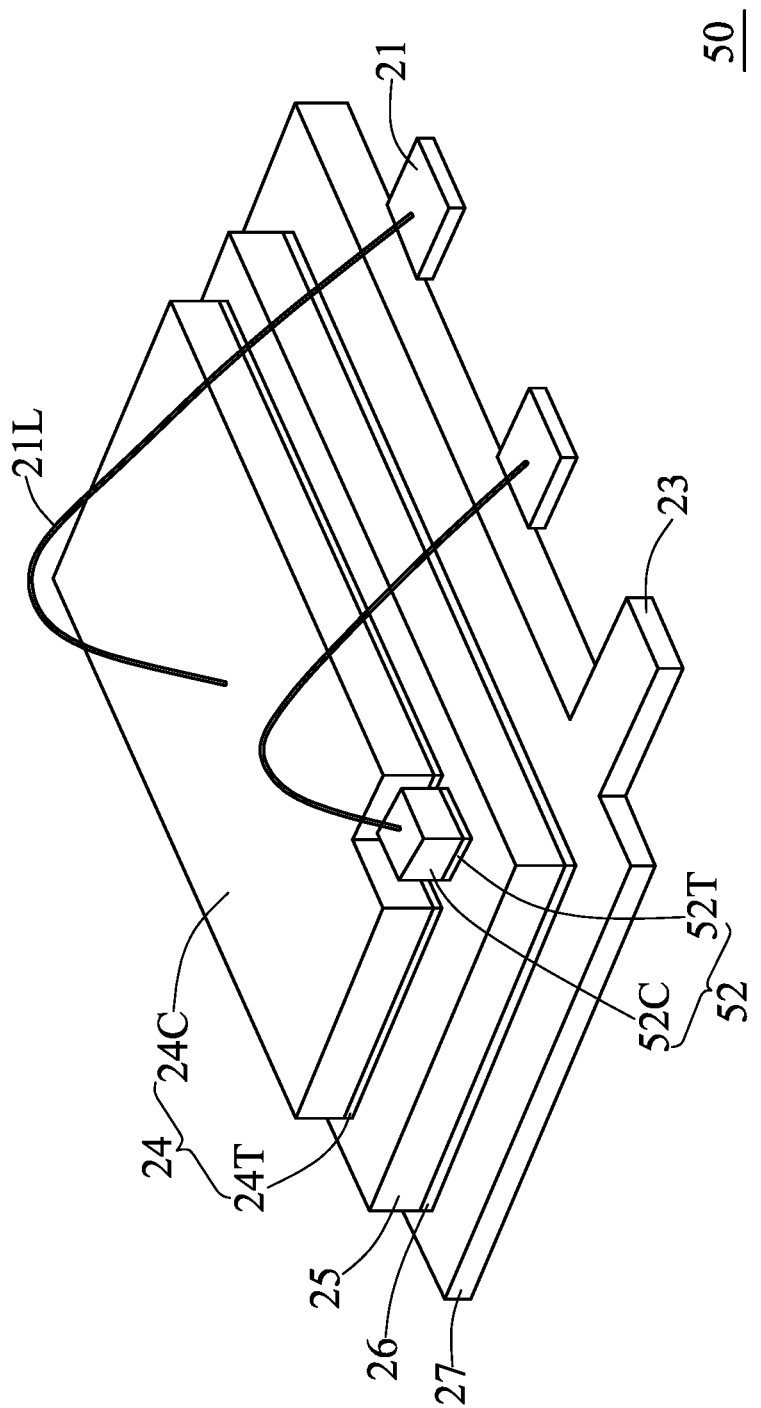
FIG. 7 shows perspective of the power semiconductor 40 of fourth embodiment.

With reference to FIG. 7 for perspective of the power semiconductor 40 of fourth embodiment. The difference between the power semiconductor 40 of FIG. 6 and FIG. 5 is that gate 52 of the power semiconductor 50 includes a fourth copper particle layer 52C and a fourth metal layer 52T. The fourth copper particle layer 52C covers the top surface of the fourth metal layer 52T, and the thickness of the fourth copper particle layer 52C is 5 μm~100 μm so that the fourth copper particle layer 52C can improve electron flow in the gate 52 and reduce operating temperature of the power semiconductor 50.

In addition, the power semiconductor of the instant application also can be used to BCD Technology. In detail, one BCD chip can include Bipolar, CMOS and DMOS. DMOS is a power device as shown in FIG. 5 and FIG. 6 of the instant application. All copper mentioned are of large grain copper with size greater than 0.25 um.

In summary, the power semiconductor of the instant application can reduce electron movement obstruction inside, improve cooling to deliver superior performance and reliability. While the preferred embodiment of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

We claim:

1. The power semiconductor comprises:
    a gate;
    a source comprising:
        a first copper particle layer; and
        a first metal layer covering the bottom surface of the first copper particle layer;
    a plurality of first long-strip metal layer, the source bonded to the first long-strip metal layer via a first metal pillar;
    a drain comprising:
        a second copper particle layer; and
        a second metal layer covering the bottom surface of the second copper particle layer;
    a plurality of second long-strip metal layer, the drain bonded to the second long-strip metal layer via a second metal pillar;
    wherein, the thickness of the first copper particle layer is greater than the thickness of the first metal layer, the thickness of the second copper particle layer is greater than the thickness of the second metal layer, the thickness of the first copper particle layer and the second copper particle layer are 5 μm~100 μm, the first copper particle layer and the second copper particle layer formed by plating and stacking a plurality of large-grain copper.

2. The power semiconductor of claim 1, wherein the gate comprises a plurality of branch structure disposed between the first long-strip metal layer and the second long-strip metal layer.

3. The power semiconductor of claim 1, wherein the first copper particle layer and second copper particle layer are as size in 2 μm~50 μm.

4. The power semiconductor of claim 1, wherein the first metal layer and the second metal layer are made of aluminum, and the thickness of the first metal layer and the second metal layer are 0.25 μm~6 μm or 0.25 μm~1 μm.

5. The power semiconductor of claim 1, wherein a third copper particle layer disposed on the top surface of the first long-strip metal layer and the second long-strip metal layer, the thickness of the third copper particle is 5 μm~100 μm, and the third copper particle is formed by stacking a plurality of large-grain copper with as size in 2 μm~50 μm.

* * * * *